United States Patent
De Anna et al.

(10) Patent No.: US 10,613,121 B2
(45) Date of Patent: Apr. 7, 2020

(54) CURRENT SENSING CIRCUIT AND CORRESPONDING METHOD

(71) Applicant: OSRAM GmbH, Munich (DE)

(72) Inventors: Paolo De Anna, Vallà di Riese Pio X (IT); Enrico Raniero, Coediverno di Vigonza (IT)

(73) Assignee: OSRAM GMBH, Munich (DE)

( * ) Notice: Subject to any disclaimer, the term of this patent is extended or adjusted under 35 U.S.C. 154(b) by 46 days.

(21) Appl. No.: 16/069,535

(22) PCT Filed: Jan. 11, 2017

(86) PCT No.: PCT/IB2017/050125
§ 371 (c)(1),
(2) Date: Jul. 12, 2018

(87) PCT Pub. No.: WO2017/122129
PCT Pub. Date: Jul. 20, 2017

(65) Prior Publication Data
US 2019/0025345 A1    Jan. 24, 2019

(30) Foreign Application Priority Data

Jan. 14, 2016  (IT) ......................... 102016000003005

(51) Int. Cl.
*G01R 15/18* (2006.01)
*G01R 19/00* (2006.01)
(Continued)

(52) U.S. Cl.
CPC ......... *G01R 15/183* (2013.01); *G01R 19/003* (2013.01); *G01R 19/0092* (2013.01); *H02M 1/08* (2013.01); *H02M 2001/0009* (2013.01)

(58) Field of Classification Search
CPC ........... G01R 15/183; G01R 19/0092; G01Rql 19/003; H02M 1/08; H02M 2001/0009
(Continued)

(56) References Cited

U.S. PATENT DOCUMENTS 7,227,347 B2 * 6/2007 Viaro ..................... G01R 15/20
324/117 H
8,479,023 B2 * 7/2013 Picard .................... G06F 1/266
324/705

(Continued)

FOREIGN PATENT DOCUMENTS

DE          3705468 A1    10/1987
GB          2378000 A      1/2003

OTHER PUBLICATIONS

International Search Report based on application No. PCT/IB2017/050125 (12 pages) dated Apr. 7, 2017 (for reference purpose only).

*Primary Examiner* — Giovanni Astacio-Oquendo
(74) *Attorney, Agent, or Firm* — Viering, Jentschura & Partner MBB

(57) ABSTRACT

A current sensing circuit for sensing an intermittent current having a Zero Current Period includes: an amperometric transformer having a primary winding for the current to be sensed to flow therethrough and a secondary winding, a sensing resistor coupled to the secondary winding of the transformer, an offset capacitor coupled with sensing resistor between the sensing resistor and ground, and a switch element acting across the coupling of the sensing resistor and the offset capacitor, the switch element being electrically conductive during the zero current period or a fraction thereof.

9 Claims, 2 Drawing Sheets

(51) Int. Cl.
*H02M 1/08* (2006.01)
*H02M 1/00* (2006.01)

(58) Field of Classification Search
USPC .................................... 324/127, 126, 76.11
See application file for complete search history.

(56) References Cited

U.S. PATENT DOCUMENTS

2003/0080723 A1    5/2003  Chen et al.
2005/0001635 A1*   1/2005  Kojima ................... B60L 7/06
                                                324/713

\* cited by examiner

CURRENT SENSING CIRCUIT AND CORRESPONDING METHOD

CROSS-REFERENCE TO RELATED APPLICATION

The present application is a national stage entry according to 35 U.S.C. § 371 of PCT application No.: PCT/IB2017/050125 filed on Jan. 11, 2017, which claims priority from Italian Patent Application Serial No.: 102016000003005 which was filed Jan. 14, 2016, and is incorporated herein by reference in its entirety and for all purposes.

TECHNICAL FIELD

The description relates to current sensing techniques.

One or more embodiments may be applied for example to the measurement of high-frequency discontinuous currents, e.g. in Switch Mode Power Supplies (SMPSs).

BACKGROUND

The problem of sensing, e.g. of measuring, high-frequency discontinuous current has been tackled in different ways while taking into account various factors, such as:
 cost,
 size,
 accuracy,
 bandwidth,
 power losses, and/or
 galvanic separation of the measured currents.

For this purpose it is possible e.g. to resort to a resistive element (such as a shunt), this solution showing however limitations as regards galvanic separation.

Another option is the use of magnetic elements (e.g. Amperometric Transformers, ATs) in combination with sensing resistors.

Such solutions are suitable e.g. for the sensing of high-frequency discontinuous currents, which are typically found in switch mode power supplies.

For example, the current to be sensed may be measured by feeding it into the primary winding of an amperometric transformer, the secondary winding whereof is coupled to a current sensing resistor.

Such a solution may offer a good usage of the magnetic core, together with a large bandwidth and low cost. However, it shows limitations due to the impossibility of sensing the DC component of the current: if a resistor is directly coupled to the secondary circuit, the volt second balance itself makes it impossible to sense the average value of the current to be measured. As a matter of fact, the volt second balance condition brings the average voltage on the sensing resistor to zero.

In a possible development of such a solution, a damping element may be inserted across the terminals of the secondary winding of the amperometric transformer (e.g. an RC network to which the current sensing resistor is coupled via a diode). This solution enables to preserve the DC component; however, a drawback is given by the high magnetic flux generated in the magnetic core, because the diode forward voltage is added to the voltage across the sensing element, when it is "seen" by the amperometric transformer. This may lead to a bigger core size and a higher number of turns.

Moreover the damping circuit, the function whereof is primarily to reset the core during the zero current period, may cause high-frequency noise and/or distortions in the measured current.

Other solutions somewhat akin to such a development are known e.g. from GB 2 378 000 A, US 2003/080723 A1 or DE 37 05 468 A1. For example, the solution proposed in GB 2 378 000 A envisages the generation of a signal proportional to the average current, as measured by a diode which "resets" the amperometric transformer during the period where the current to be measured is zero, thus obtaining a signal proportional to the average current, with large amplitude and therefore a high signal-to-noise ratio.

SUMMARY

One or more embodiments aim at overcoming the previously outlined drawbacks, e.g. by improving the usage conditions of the magnetic core, while simultaneously reducing the number of turns in the amperometric transformer.

According to one or more embodiments, the object may be achieved by a circuit having the features specifically set forth in the claims that follow.

One or more embodiments may also concern a corresponding method.

The claims are an integral part of the technical teaching provided herein with reference to the embodiments.

One or more embodiments lead to an improvement of the usage conditions of the amperometric transformer, e.g. by reducing the core size and the number of turns in the windings.

One or more embodiments may lead to an accurate, low-noise current measurement, with the availability of a filtered average current value.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DETAILED DESCRIPTION

In the following description, numerous specific details are given in order to provide a thorough understanding of various exemplary embodiments. The embodiments may be practiced without one or several of the specific details, or with other methods, components, materials, etc. In other instances, well-known structures, materials, or operations are not shown or described in detail to avoid obscuring the various aspects of the embodiments.

Reference throughout this specification to "one embodiment" or "an embodiment" means that a particular feature, structure or characteristic described in connection with the embodiment is included in at least one embodiment. Thus, the possible appearances of the phrases "in one embodiment" or "in an embodiment" in various places throughout this specification are not necessarily all referring exactly to the same embodiment. Furthermore, particular features, structures, or characteristics may be combined in any suitable manner in one or more embodiments.

The word "exemplary" or "exemplify" is used herein to mean "serving as an example, instance, or illustration". Any embodiment or design described herein as "exemplary" is not necessarily to be construed as preferred or advantageous over other embodiments or designs.

The references provided herein are given for convenience only, and therefore do not interpret the extent of protection or the scope of the embodiments.

Figure 1:
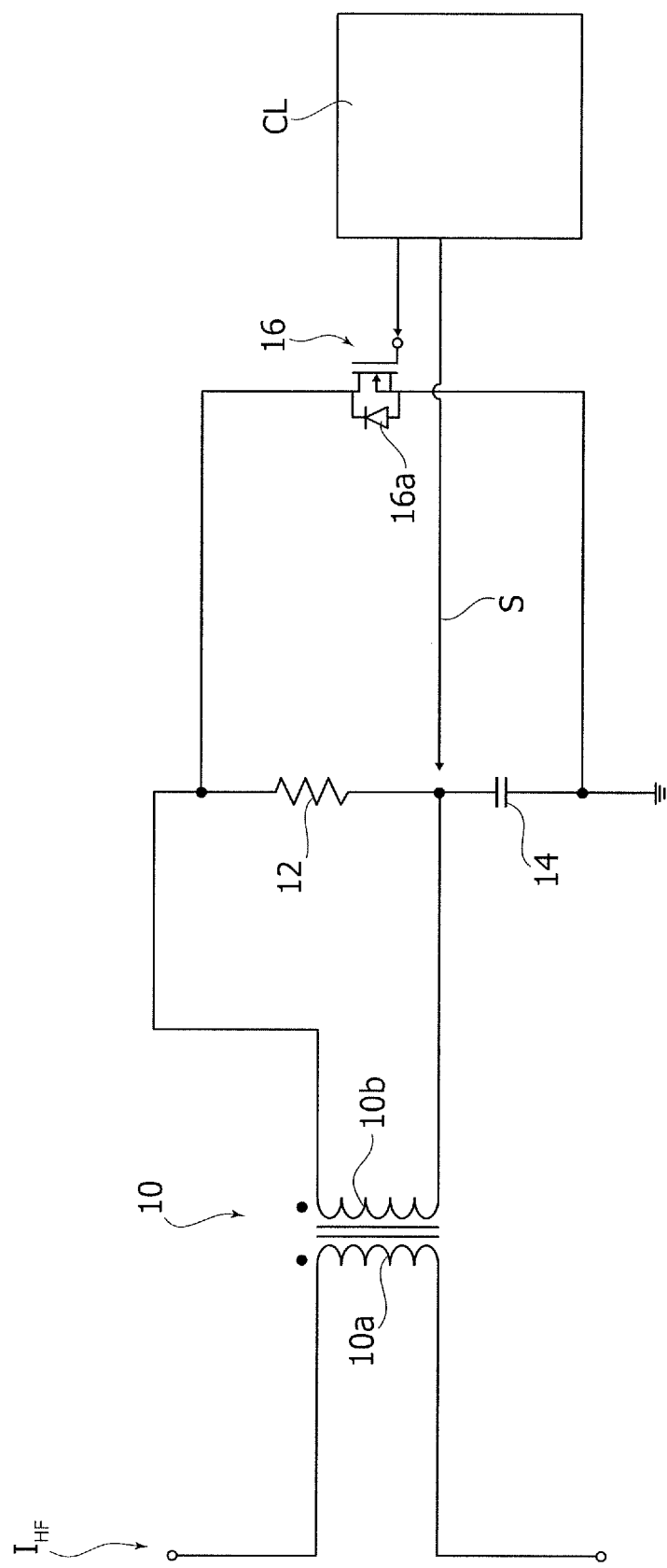
FIG. 1 is a circuit diagram exemplifying embodiments.

In the diagram of FIG. 1, reference 10 denotes an (amperometric) transformer adapted to receive a current $I_{HF}$ to be sensed on its primary winding 10a.

This current may be e.g. a high-frequency discontinuous current, which must be measured with good accuracy. Such a need may be felt e.g. in switch mode power supplies.

In one or more embodiments, current $I_{HF}$ may be fed to primary winding 10a of amperometric transformer 10 by flowing between one of the terminals of primary winding 10a and the opposed terminal of such a winding, which may be considered as connected to ground.

In one or more embodiments, transformer 10 may have a secondary winding 10b coupled to a sensing resistor 12.

In one or more embodiments, resistor 12 may simply be connected across the secondary winding 10b.

Reference 14 denotes a capacitor which, in one or more embodiments, may include a first terminal connected to resistor 12 at one of the ends of the secondary winding 10b of transformer 10, and a second terminal connectable to ground, so that capacitor 14 is adapted to be interposed between resistor 12 and its ground, i.e. between one of the terminals of secondary winding 10b of transformer 10 and ground.

In one or more embodiments, a component 16 having the function of a switch may be connected across the RC network comprising resistor 12 and capacitor 14 (i.e. between the other end of secondary winding 10b of transformer 10 and the second terminal of capacitor 14, intended to be connected to ground).

In one or more embodiments, switch 16 may be an active switch, such as, for example, an electronic switch, e.g. a MOSFET or a JFET.

One or more embodiments, wherein the component acting as a switch 16 is an active switch, may include a control logic CL (which in itself may be absent in some embodiments).

In one or more embodiments, logic CL may be implemented as a function of the control logic of a switch mode power supply (not visible in the Figures).

In one or more embodiments, logic CL may also be connected to a line S, adapted to sense the voltage across capacitor 14, such a voltage being adapted to represent the (average) measured value of current $I_{HF}$.

According to the operation principle of an arrangement as exemplified in FIG. 1, the sensing function of current $I_{HF}$ is performed by resistor 12, which acts as a sensing element (directly) coupled to secondary winding 10b of the amperometric transformer.

Capacitor 14 performs an offset blocking function between sensor 12 and reference ground, and therefore keeps the DC offset of the measured current, therefore making it possible to sense, e.g. at the terminal of resistor 12 opposed to offset capacitor 14, the instantaneous value of the current to be sensed, including the DC component, with the possibility of obtaining an average over the whole switching period, due to the magnetizing inductance of transformer 10, through which a direct current flows which equals the average of the measured current.

Switch 16 (e.g. an active switch) may be turned on (i.e. rendered conductive) for a given period of time, which may be short, e.g. a fraction of the period during which current $I_{HF}$ (which is discontinuous, i.e. intermittent) is at zero, during the so-called Zero Current Period (ZCP). It is therefore possible to store the voltage offset, related to the zero current level of the measured current, into capacitor 16, which performs a sort of Sample & Hold (S&H) function.

One or more embodiments, therefore, lead to an improvement of the usage conditions of the magnetic core of transformer 10, by reducing the flux and decreasing the number of turns, i.e. the size and the cost, of amperometric transformer 10.

It will be appreciated that, in one or more embodiments, component 16 is not directly traversed by the measured current. This enables the use of a higher on-resistance, with a corresponding cost reduction.

One or more embodiments may omit damping elements and are free of discontinuities in the core flux.

Across capacitor 14 (e.g. via a sensing line S) a signal may be sensed which represents the (average) value of current $I_{HF}$, no additional filters being required.

Figure 2:
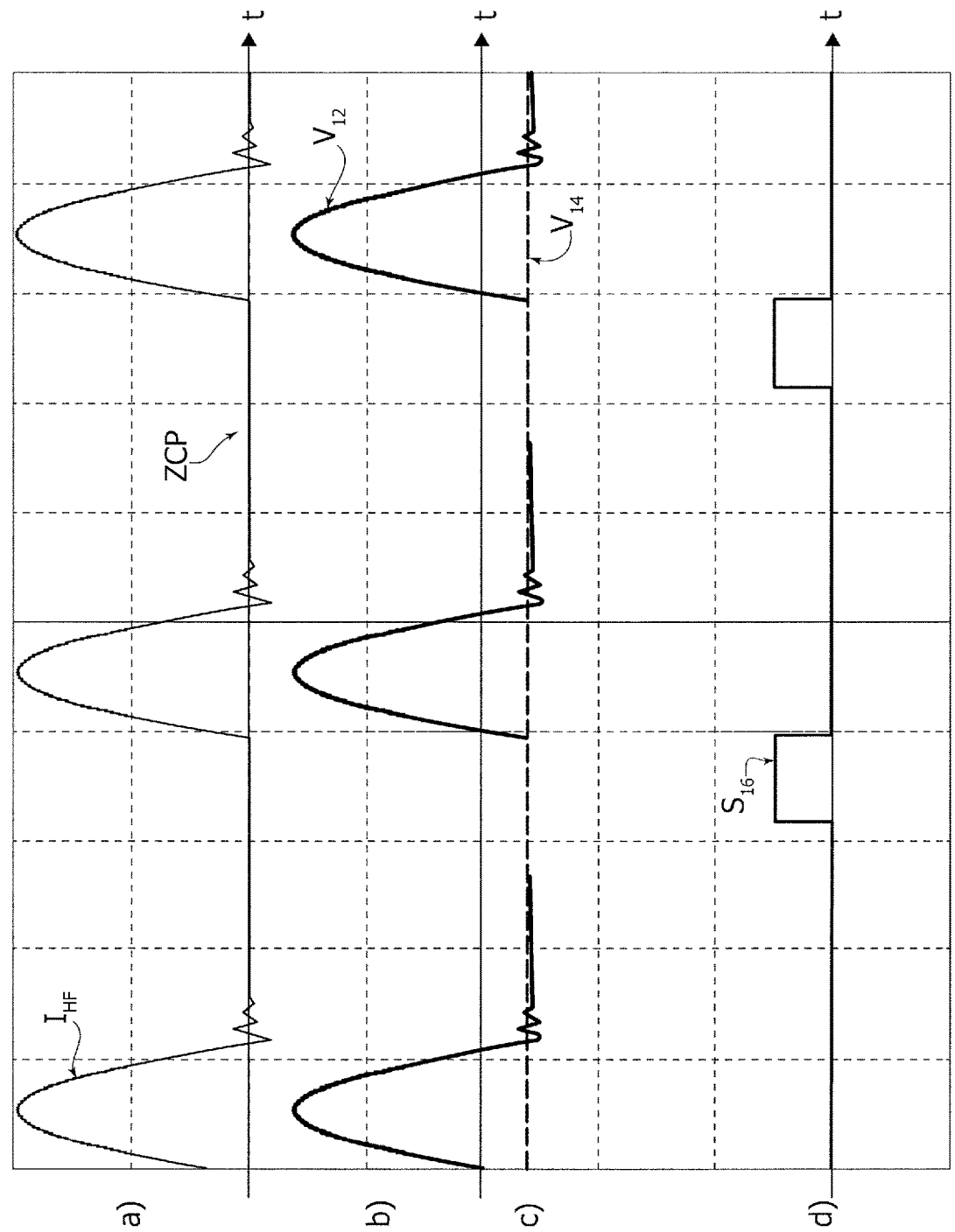
FIG. 2, which comprises three overlying portions respectively denoted as a), b), c) and d), exemplifies possible signal graphs of one or more embodiment.

In the diagrams of FIG. 2:
- the upper portion, denoted as a), exemplifies a possible behaviour of the current $I_{HF}$ to be sensed/measured, the Zero Current Period (ZCP) being denoted with a corresponding reference;
- the portion denoted as b) exemplifies a possible behaviour of voltage $V_{12}$, which may be sensed on resistor R12 (average value=0);
- the portion denoted as c) exemplifies a possible behaviour of voltage $V_{14}$ across offset capacitor 14 (reversed line), representative of the average value of the measured current, and
- the portion denoted as d) represents a possible command signal S16 of the gate of switch 16.

In one or more embodiments, when switch 16 is an active switch, the respective driving function may be such that, when switch 16 is active, the zero level across sensing resistor 12 is sampled on offset capacitor 14.

The command on the driving electrode (e.g. gate) of switch 16 may be any signal synchronized with current $I_{HF}$. The driving signal may be derived from logic CL, e.g. on the basis of the command signal for driving the switching of the power electronic switches of the corresponding power supply. As a non-limiting example, the active signal may be controlled by the gate command signal on the low side of a resonant converter.

In one or more embodiments, switch 16 may be activated (e.g. rendered conductive) during the Zero Current Period (ZCP), e.g. for a fraction thereof, for the period of time during which the current value across current sensing resistor 12 is stored into the offset capacitor 14.

One or more embodiments, therefore, may envisage the presence of a switch element (e.g. switch 16) acting across the coupling of sensing resistor 12 and offset capacitor 14, the switch element 16 being electrically conductive during at least a fraction of the zero current period, i.e. during the ZCP or a fraction thereof.

In one or more embodiments, the function of component 16 may be performed not by an active switch as previously exemplified, but by a diode, e.g. a diode having the same connection polarity of body diode 16a of switch 16 exemplified as a MOSFET in the diagram of FIG. 1, i.e. with the cathode and the anode respectively facing towards capacitor 14 and resistor 12, so that such diode may act as a switch which becomes electrically conductive automatically, when the (direct) voltage thereacross exceeds the threshold voltage of the diode. In that case, one or more embodiments may take into account a possible measurement offset or error e.g. amounting to 0.5 V and depending on the temperature. The obtained advantages include simplicity and cost reduction, due to the use of a diode instead of an active switch.

Of course, without prejudice to the basic principle, the implementation details and the embodiments may vary, even appreciably, with respect to what has been described herein by way of non-limiting example only, without departing from the extent of protection.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

The invention claimed is:

1. A current sensing circuit for sensing an intermittent current having a zero current period, the current sensing circuit comprising:
    an amperometric transformer having a primary winding for intermittent the current to flow therethrough and a secondary winding,
    a sensing resistor connected across terminals of the secondary winding of the amperometric transformer,
    an offset capacitor coupled with the sensing resistor at one of the terminals of the secondary winding of the amperometric transformer, the offset capacitor connectable to ground with the offset capacitor set between the sensing resistor and ground, and
    a switch element acting across an RC network formed by the sensing resistor and the offset capacitor, the switch element electrically conductive during the zero current period or a fraction thereof.

2. The current sensing circuit of claim 1, wherein the switch element comprises an electronic switch driveable to become electrically conductive during the zero current period or the fraction thereof.

3. The current sensing circuit of claim 2, wherein the electronic switch further comprises a MOSFET or a JFET.

4. The current sensing circuit of claim 1, wherein the switch element comprises a diode.

5. The current sensing circuit of claim 4, wherein the diode has its anode coupleable to ground.

6. A method of sensing an intermittent current having a zero current period, the method comprising:
    feeding the intermittent current to a primary winding of an amperometric transformer,
    connecting a sensing resistor across terminals of a secondary winding of the amperometric transformer,
    coupling with the sensing resistor at one of the terminals of the secondary winding of the amperometric transformer an offset capacitor with the offset capacitor set between the sensing resistor and ground, and
    providing a switch element across an RC network formed by the sensing resistor and the offset capacitor, the switch element electrically conductive during the zero current period or a fraction thereof.

7. The method of claim 6, further comprising:
    providing an electronic switch as the switch element, and
    driving the electronic switch by rendering it electrically conductive during the zero current period or the fraction thereof.

8. The method of claim 6, further comprising providing a diode as the switch element.

9. The method of claim 8, further comprising coupling the anode of the diode to ground.

* * * * *